United States Patent
Ohta

(10) Patent No.: US 8,253,100 B2
(45) Date of Patent: Aug. 28, 2012

(54) ELECTRON MICROSCOPE

(75) Inventor: Shigemasa Ohta, Tokyo (JP)

(73) Assignee: JEOL Ltd., Tokyo (JP)

( * ) Notice: Subject to any disclaimer, the term of this patent is extended or adjusted under 35 U.S.C. 154(b) by 166 days.

(21) Appl. No.: 12/818,509

(22) Filed: Jun. 18, 2010

(65) Prior Publication Data

US 2011/0139986 A1    Jun. 16, 2011

(30) Foreign Application Priority Data

Jun. 19, 2009 (JP) ................ 2009-146193

(51) Int. Cl.
*H01J 37/26* (2006.01)
*H01J 37/00* (2006.01)
(52) U.S. Cl. ............. 250/311; 250/309; 250/310
(58) Field of Classification Search .......... 250/309, 250/310, 311
See application file for complete search history.

(56) References Cited

U.S. PATENT DOCUMENTS

| | | | | |
|---|---|---|---|---|
| 6,949,741 | B2 * | 9/2005 | Cody et al. | 250/288 |
| 7,112,785 | B2 * | 9/2006 | Laramee et al. | 250/288 |
| 7,923,686 | B2 * | 4/2011 | Fukushima | 250/311 |
| RE43,078 | E * | 1/2012 | Cody et al. | 250/288 |
| 2005/0196871 | A1 * | 9/2005 | Cody et al. | 436/173 |
| 2009/0159797 | A1 * | 6/2009 | Fukushima | 250/311 |
| 2011/0139986 | A1 * | 6/2011 | Ohta | 250/311 |

FOREIGN PATENT DOCUMENTS

JP    2003187735 A    7/2003

* cited by examiner

*Primary Examiner* — David A Vanore
(74) *Attorney, Agent, or Firm* — The Webb Law Firm

(57) ABSTRACT

An electron microscope has an electron beam source generating an accelerated electron beam, electromagnetic lenses for converging the electron beam, alignment coils for adjusting the optical axis of the beam transmitted through the lenses, a control unit for controlling the ambient around a specimen, at least one vacuum pump mounted in a given location of the electron optical column, a gas inlet device mounted near the specimen, an imager for creating an image based on a signal arising from the region of the specimen illuminated with the beam, an image output device for recording and displaying the image, and a computer for controlling these components. The computer finds the orifices to be used and diameters of orifices at which the pressure is maintained without electrical discharge in an electron beam source from the selected gas species and the pressure around the specimen.

7 Claims, 4 Drawing Sheets

|  | | H2 | N2 | CO2 |
|---|---|---|---|---|
| Pa | 1000 | A | C | D |
| | 100 | A | C | D |
| | 10 | B | C | B |

FIG.4

| | OR31 | OR32 | OR33 | PUMP |
|---|---|---|---|---|
| A | 100 μm | 100 μm | 100 μm | ION PUMP |
| B | 10 μn | 10 μn | 10 μn | TURBOMOLECULAR PUMP |
| C | | | | |
| D | | | | |

FIG.5

ELECTRON MICROSCOPE

BACKGROUND OF THE INVENTION

1. Field of the Invention

The present invention relates to an electron microscope and, more particularly, to an electron microscope permitting one to observe the reaction process of a specimen under certain ambient conditions. The invention can be applied to transmission scanning electron microscopes, transmission electron microscopes, and scanning electron microscopes.

2. Description of Related Art

In the field of electron microscope imaging technology, numerous techniques for imaging specimens and their surroundings under non-vacuum ambients have been already disclosed. Their purpose is to elucidate the mechanism of a reaction, for example, between a gas and a solid by observing and analyzing the reaction process with an electron microscope at an atomic level. Up to now, there are reports in which the mechanism of a reaction between a gas and a solid or between a liquid and a solid has been clarified by the above-described method.

For example, a technique for controlling the ambient around a specimen by incorporating a gas inlet mechanism and a gas tube extending close to the specimen into a specimen holder for an electron microscope and supplying an arbitrary gas into the gas tube such that the gas is introduced through the gas inlet mechanism is disclosed (see, for example, JP-A-2003-187735 (paragraphs 0023-0031; FIG. 1)). The specimen holder has a grip in which a connector for gas introduction is mounted. A gas pipe extends from the grip to the vicinity of a specimen stage on which the specimen is set. Gas can be introduced close to the specimen through the gas pipe in the holder via the gas introduction connector of the grip. Accordingly, the reaction process between a gas and a solid can be observed with the electron microscope while the gas is flowing. This contributes to elucidation of the mechanism of the reaction between the solid and gas.

However, if the above-described technique is used alone, the pressure in the vicinity of the specimen chamber can be increased only up to about $10^{-3}$ Pa to $10^{-5}$ Pa. In this case, if the reaction process between a gas and a solid is observed and fundamental knowledge should be obtained, then satisfactory results would be obtained. However, it is expected by the industrial world that the mechanism of the process between a gas and a solid in an atmosphere closer to atmospheric will be elucidated. Hence, it is desired that a breakthrough will be made in this technical field.

According to a conventional technique different from the aforementioned technique, the pressure around the specimen chamber can be increased nearly up to the atmospheric pressure by optimizing the gas flow rate. However, if the specimen holder is inserted into a general-purpose electron microscope and gas is supplied until the pressure in the vicinity of the specimen chamber is increased to the atmospheric pressure, then the pressure is increased even up to the electron beam source including acceleration tubes. This creates the possibility that electrical discharge is caused, damaging the microscope. Furthermore, pressure increase in the vicinity of the optical axis leads to a decrease in the penetrative power of the electron beam or to a deterioration of the resolution. In addition, the critical pressure at which electrical discharge in the electron beam source occurs, the penetrative power of the electron beam, and resolution differ according to gas species. In this way, the electron microscope fails to cope with various conditions sufficiently. Consequently, imaging of the process of the reaction between a gas and a solid in an almost actual environment (e.g., in the atmospheric condition) has not been substantially accomplished.

SUMMARY OF THE INVENTION

It is an object of the present invention to provide an electron microscope capable of observing the process of a reaction between a gas and a solid, for example, at atmospheric pressure. It is another object of the present invention to provide an electron microscope which can be controlled to conditions suitable for various gases under atmospheric ambient conditions while using a conventional holder and, thus, enabling imaging of the process of the reaction between the gas and solid under atmospheric pressure that is close to ambients actually encountered.

A first embodiment of the present invention which achieves the foregoing object provides an electron microscope having an electron beam source for generating an accelerated electron beam, electromagnetic lenses for focusing the accelerated electron beam, alignment coils for adjusting the optical axis of the beam transmitted through the lenses, a control unit for controlling an ambient around a specimen, a plurality of orifices arranged inside the electron optical column and placed between the specimen and the electron beam source, each of the orifices being capable of changing its diameter, at least one vacuum pump mounted in a given location of an electron optical column, a gas inlet device mounted near the specimen, an imager for creating an image based on a signal arising from a region of the specimen illuminated with the electron beam, an image output device for recording and displaying the image, and a computer for controlling these components. The computer being programmed to find the orifices to be used and diameters of orifices capable of sustaining a pressure at which electrical discharge in the electron beam source does not occur from the selected gas species and pressure around the specimen.

A second embodiment of the present invention provides an electron microscope having an electron beam source for generating an accelerated electron beam, electromagnetic lenses for focusing the accelerated electron beam, alignment coils for adjusting the optical axis of the beam transmitted through the lenses, a control unit for controlling an ambient around a specimen, at least one vacuum pump mounted in a given location of an electron optical column, a gas inlet device mounted near the specimen, an imager for creating an image based on a signal arising from a region of the specimen illuminated with the electron beam, an image output device for recording and displaying the image, and a computer for controlling these components. A plurality of orifices are arranged inside the electron optical column and placed between the specimen and the imager, each of the orifices being capable of changing its diameter. The computer being programmed to find the orifices to be used and diameters of the orifices from the selected gas species and pressure around the specimen such that the pressure in a region extending from the specimen to the imager permits the beam to maintain its sufficient penetrative and resolving power.

A third embodiment of the present invention provides an electron microscope having an electron beam source for emitting an electron beam, electromagnetic lenses for focusing the emitted beam, alignment coils for adjusting the optical axis of the beam transmitted through the lenses, a control unit for controlling an ambient around a specimen, at least one vacuum pump mounted in a given location of an electron optical column, a gas inlet device mounted near the specimen, an imager for creating an image based on a signal arising from a region of the specimen illuminated with the electron beam, an image output device for recording and displaying the image, and a computer for controlling these components, a plurality of orifices arranged inside the electron optical column and placed between the electron beam source and the specimen and between the specimen and the imager, each of the orifices being capable of changing its diameter. The computer being programmed to find the orifices placed between the electron beam and the specimen to be used and diameters of the found orifices capable of sustaining a pressure at which electrical discharge in the electron beam source does not occur from the selected gas species and pressure around the specimen and finds the orifices placed between the electron beam and the specimen to be used and diameters of the found orifices placed between the specimen and the imager from the selected gas species and pressure around the specimen such that the pressure in a region extending from the specimen to the imager permits the beam to maintain its sufficient penetrative and resolving power.

A fourth embodiment of the present invention is based on any one of the first through third embodiments and further characterized in that when the ambient conditions around the specimen are specified from an input portion of the computer, the computer selects some or all of the orifices, inserts them, and selects a pumping sequence according to the specified conditions.

A fifth embodiment of the present invention is based on the fourth embodiment and further characterized in that the selection and insertion of the orifices and selection of the pumping sequence are defined by the selected gas species, pressure around the specimen, and a minimum magnification during imaging.

A sixth embodiment of the present invention is based on any one of the first through third embodiments and further characterized in that the orifices are at least two in number and located at different positions in an optical path.

A seventh embodiment of the present invention is based on any one of the first through third embodiments and further characterized in that the orifices form at least two combinations of orifice diameters and the combinations are placed at different locations in an optical path.

According to the first embodiment of the present invention, an electron microscope can be offered which permits one to observe the process of a reaction between a gas and a solid at an atmospheric pressure close to ambients actually encountered because the computer finds the orifices to be used and diameters of the orifices capable of sustaining a pressure at which electrical discharge in the electron beam source including an accelerating tube does not occur from the gas species and the pressure around the specimen.

According to the second embodiment, an electron microscope can be offered which permits one to observe the process of a reaction between a gas and a solid at an atmospheric pressure close to ambients actually encountered because the computer finds the orifices to be used and diameters of the orifices installed between the specimen and the imager from the gas species and the pressure around the specimen in order that the pressure in the region extending from the specimen to the imager permits the beam to maintain its sufficient penetrative and resolving power.

According to the third embodiment, an electron microscope can be offered which permits one to observe the process of a reaction between a gas and a solid, for example, at the atmospheric pressure. Furthermore, the microscope can be controlled to conditions adapted for various gases under atmospheric-pressure conditions while using a conventional holder and so an electron microscope can be offered which permits one to observe the process of a reaction between a gas and a solid at an atmospheric pressure close to ambients actually encountered.

According to the fourth embodiment, if ambient conditions around the specimen are specified from a control portion of the computer, then some or all of the orifices are selected and inserted and a pumping sequence is selected according to the specified conditions.

According to the fifth embodiment, selection and insertion of the orifices and the selection of the pumping sequence can be defined by the used gas species, the pressure around the specimen, and a minimum magnification during imaging.

According to the sixth embodiment, the ambient around the specimen can be matched to the specified conditions by installing at least two orifices at different positions in the optical path.

According to the seventh embodiment, the ambient around the specimen can be matched to the specified conditions by placing orifices forming different combinations of orifice diameters at different positions in the optical path.

Other objects and features of the invention will appear in the course of the description thereof, which follows.

BRIEF DESCRIPTION OF THE DRAWINGS

FIG. 4 is a table illustrating operating conditions determined by gas species and pressure; and FIG. 5 is a table illustrating the manner in which various operating conditions are set.

DESCRIPTION OF THE PREFERRED EMBODIMENTS

The preferred embodiments of the present invention are hereinafter described in detail.

Figure 1:
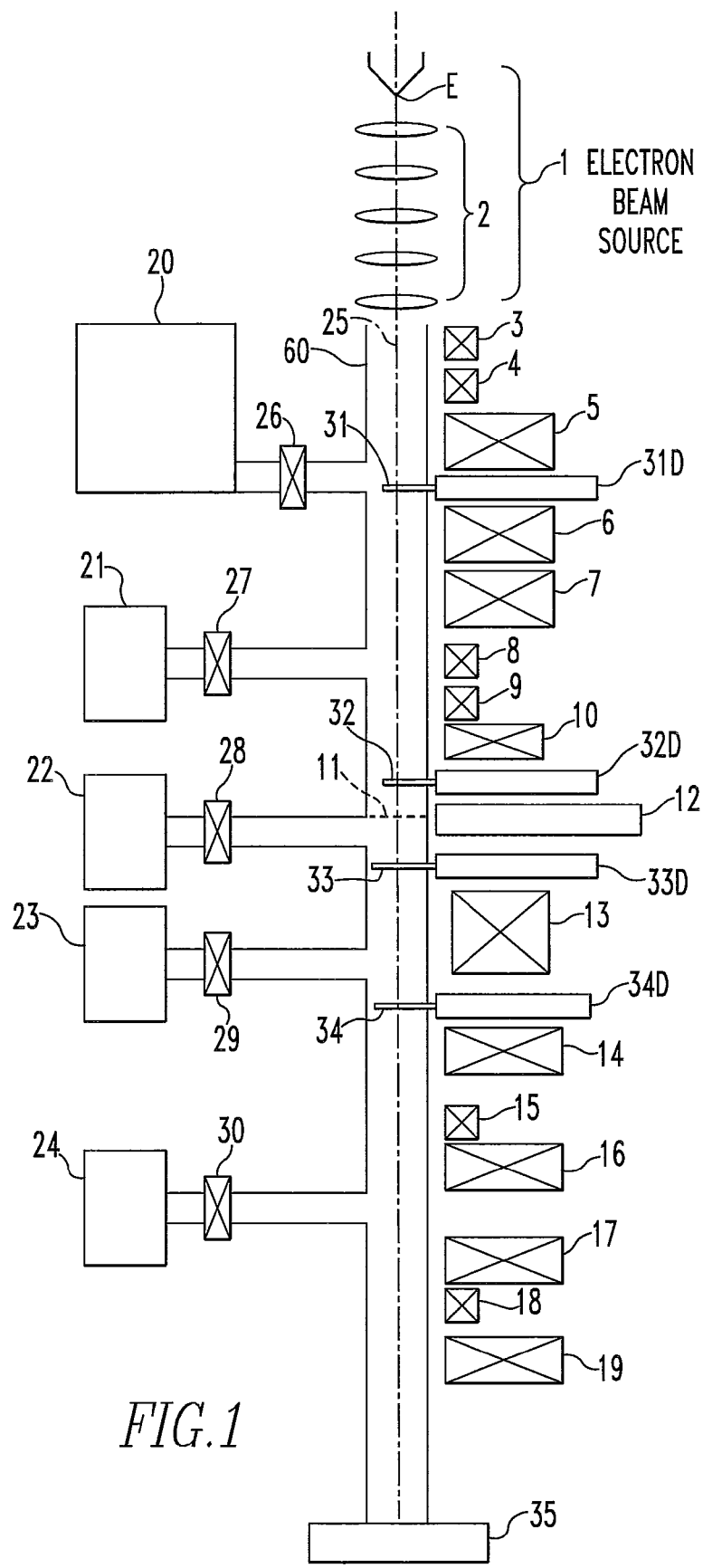
FIG. 1 is a diagram of an electron microscope associated with the present invention, showing an example of the structure of the microscope.

FIG. 1 shows an example of the structure of an electron microscope associated with the present invention. In this embodiment, the microscope is a transmission electron microscope (TEM). The microscope has an electron beam source 1 comprising an electron beam emitter and an acceleration tube 2 for accelerating the emitted electron and forming an accelerated electron beam. The central orbit of the beam, or electron optical axis, is indicated by 25. First and second alignment coils 3 and 4, respectively, adjust the optical axis of the beam. A first electromagnetic lens 5 focuses the beam. Furthermore, the microscope has an electron optical column 60 in which a first orifice member 31 is installed. The orifice member 31 is arranged to divide the column 60 into upper and lower sections and has a plurality of openings (orifices), each of which has a different diameter and is selectably positioned at the electron optical axis 25 by an orifice member driving mechanism 31D in order to permit the electron beam and gas species to pass through.

Second and third electromagnetic lenses 6 and 7, respectively, converge the electron beam. The inside of the electron optical column is evacuated by an ion pump 20. A first valve 26 is mounted between the ion pump 20 and the column 60. The inside of the column is also evacuated by a first turbomolecular pump 21. A second valve 27 is mounted between the turbomolecular pump 21 and the column 60. Third and fourth alignment coils 8 and 9, respectively, adjust the optical axis of the beam. A fourth electromagnetic lens 10 converges the beam. A second orifice member 32 is mounted inside the column 60 and is similar in structure with the first orifice member 31 and driven by the orifice member driving mechanism 32D.

A specimen 11 is placed in the electron optical column and centered at the optical axis 25. A gas inlet mechanism 12 (gas inlet device) ejects gas to maintain a desired pressure inside the ambient around the specimen 11. The gas inlet mechanism 12 will be described in further detail later. The inside of the electron optical column 60 is evacuated by a second turbomolecular pump 22. A third valve 28 is mounted between the pump 22 and the column. A third orifice member 33 is located under the specimen 11 and is similar in structure with the first orifice member 31 and driven by the orifice member driving mechanism 34D.

A fifth electromagnetic lens 13 is located under the third orifice member 33 and converges the electron beam. A third turbomolecular pump 23 evacuates the inside of the electron optical column 60. A fourth valve 29 is located between the third turbomolecular pump 23 and the column 60. A fourth orifice member 34 is mounted under the fifth electromagnetic lens 13 and is similar in structure with the first orifice member 31. A sixth electromagnetic lens 14 converges the transmitted beam.

A fifth alignment coil 15 adjusts the optical axis of the transmitted electron beam. A seventh electromagnetic lens 16 located under the fifth alignment coil 15 converges the transmitted beam. An eighth electromagnetic lens 17 is located under the seventh electromagnetic lens 16. A sixth alignment coil 18 is mounted under the eighth electromagnetic lens 17. A ninth electromagnetic lens 19 is located under the sixth alignment coil 18 and converges the beam.

A fourth turbomolecular pump 24 evacuates the inside of the electron optical column 60. A fifth valve 30 is mounted between the fourth turbomolecular pump 24 and the column 60. An imager 35 images the transmitted electron beam and creates an image of it.

The electromagnetic lenses 5, 6, 7, and 10 together constitute an illumination optical system. The electromagnetic lenses 13, 14, 16, 17, and 19 together constitute an imaging optical system. The ninth electromagnetic lens 19 acts as a projector lens for projecting the transmitted electron beam onto the imager 35.

Figure 2:
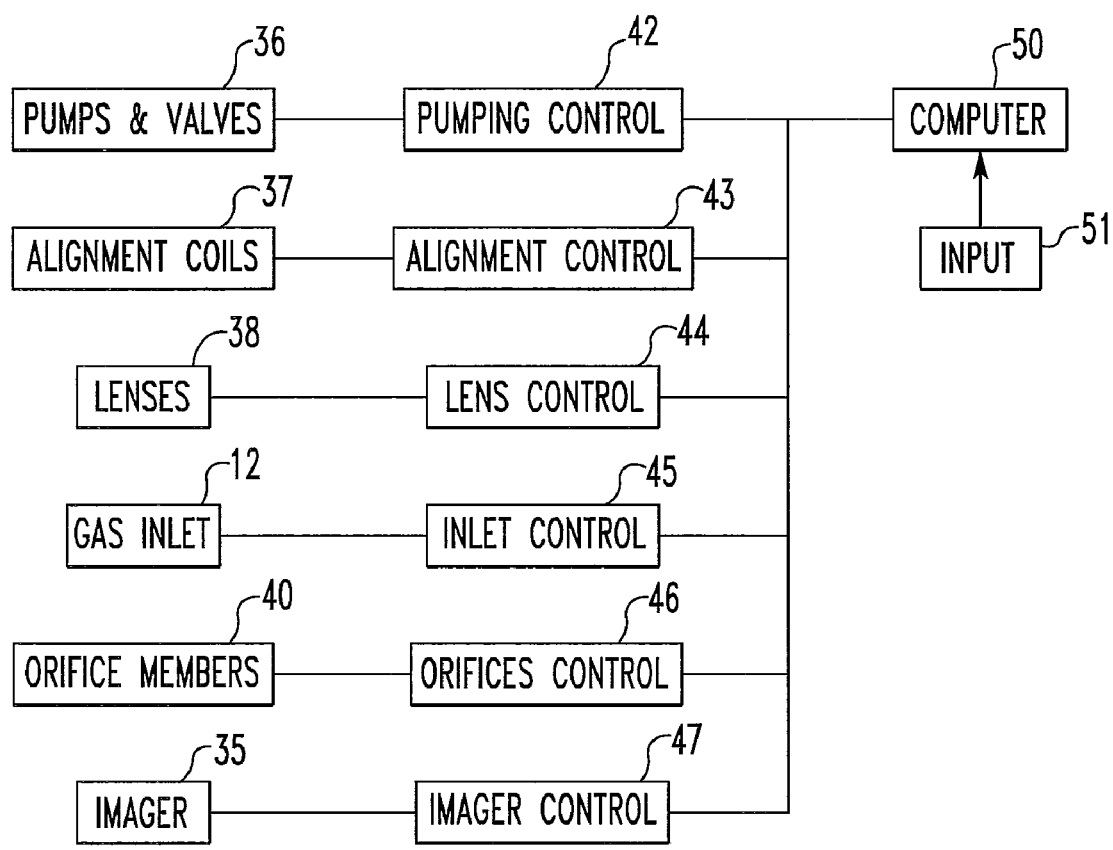
FIG. 2 is a block diagram of a control system according to the present invention.

FIG. 2 shows an example of structure of a control system, according to the present invention. In both FIGS. 1 and 2, like components are indicated by like reference numerals. The control system includes a set of vacuum pumps and valves 36, a pumping control unit 42 for controlling the operations of the set of vacuum pumps and valves 36, alignment coils 37, and an alignment coil control unit 43 for controlling the operations of the alignment coils 37.

Furthermore, the control system includes a set of electromagnetic lenses 38, a lens control unit 44 for controlling the operations of the electromagnetic lenses 38, the gas inlet mechanism 12, a gas inlet mechanism control unit 45 for controlling the gas inlet mechanism 12, orifice member 40 (orifice member driving mechanisms 31D, 32D, 33D, 34D), an orifice control unit 46 for controlling the orifice member driving mechanism 40, the aforementioned imager 35, an image recording and displaying unit 47 for controlling the imager 35, and a controlling computer 50 that controls the operation of the pumping control unit 42, alignment coil control unit 43, lens control unit 44, gas inlet mechanism control unit 45, orifice control unit 46, and image recording and displaying unit 47. An input portion 51 connected with the computer 50 is used to input various settings into the computer 50. For example, a keyboard or mouse is used as the control portion 51. The operation of the electron microscope constructed in this way, in accordance with the present invention, is described below.

The electron beam emitted from the emitter is accelerated to a desired energy by the acceleration tubes 2 to form an accelerated electron beam. The electron beam is focused into a desired shape by the electromagnetic lenses 5, 6, 7, and 10, and made to hit the specimen 11. The beam transmitted and diffracted through the specimen 11 is magnified by the electromagnetic lenses 13, 14, 16, 17, and 19 and imaged by the imager 35. The image is recorded and displayed by the image recording and displaying unit 47. The alignment coil control unit 43 controls the alignment coils 37 such that the beam passes through the principal plane of each electromagnetic lens. The operations described so far are operations of general-purpose electron microscopes.

Plural compressed gas cylinders are connected with the gas inlet mechanism 12 via plural valves. Any arbitrary gas can be introduced close to the specimen via the gas inlet mechanism. The introduced gas species can be hydrogen, oxygen, carbon monoxide, carbon dioxide, nitrogen, rare gas, or mixture thereof.

Figure 3:
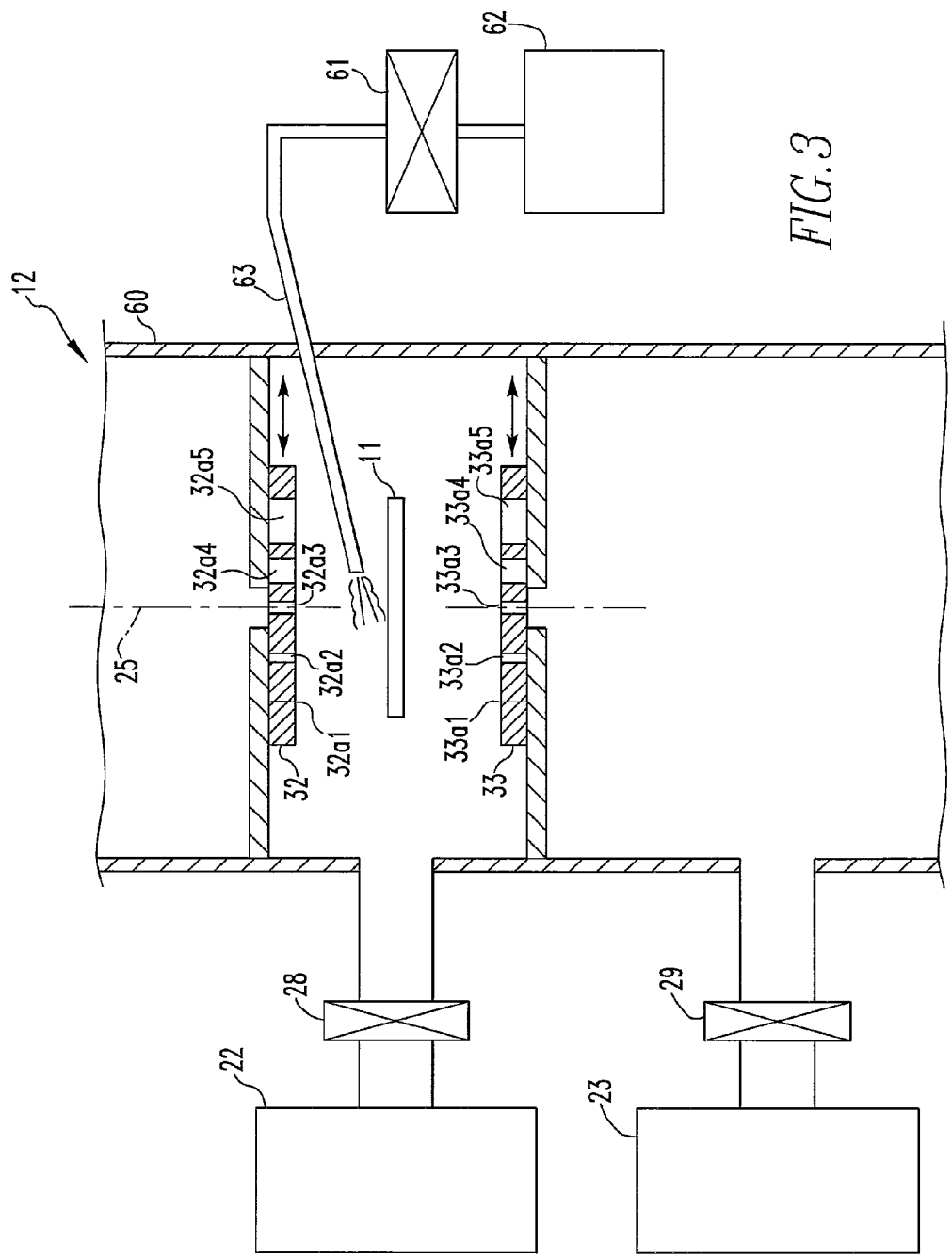
FIG. 3 is a vertical cross section of the gas inlet mechanism included in the control system shown in FIG. 2.

FIG. 3 is a vertical cross section of the gas inlet mechanism 12 and the orifice members 32 and 33, showing an example of the structure. In both FIGS. 1 and 3, like components are indicated by like reference numerals. The electron optical column of the electron microscope is indicated by numeral 60. A specimen 11 is held by a specimen holder (not shown) and positioned in a specimen chamber. The second orifice member 32 is installed on the under surface of the upper wall of the specimen chamber so that a through hole of the upper wall made at the cross point with the optical axis 25 is sealed by the second orifice member 32, while the third orifice member 33 is located on the surface of the lower wall of the specimen 11. The second orifice member 32 has five openings (orifices) $32a1$-$32a5$ with different diameters and is slidable along the upper wall to permit one of the five openings to locate at the optical axis 25. Similarly, the third orifice member 33 has five openings (orifices) $33a1$-$33a5$ with different diameters and is slidable along the upper wall to permit one of the five openings to locate at the optical axis 25.

The second turbomolecular pump 22 evacuates the inside of the column 60 through the third valve 28. The third turbomolecular pump 23 evacuates the inside of the column 60 via the fourth valve 29. Compressed gas cylinders 62 are filled with various gases. A sixth valve 61 is connected with the gas cylinders 62 and permits ejection of gas onto the specimen 11 via a pipe 63.

Preferably, each gas cylinder 62 is mounted close to the gas inlet device to control the pressure around the specimen smoothly. The gas cylinders 62 are plural according to the selected gas species. Where each gas cylinder is spaced more than 100 cm from the gas inlet device because of limitations on the installation location, it is desired to mount a buffer tank near the gas inlet device, although affected also by the inside diameter of the pipe 63.

Actual gas introduction, the operation (selection) of the orifices performed at this time, and control of vacuum pumping are next described. A selected gas species and a required pressure around the specimen to be achieved are set by an operator from the input portion 51 on the computer 50. Then, a minimum magnification during imaging is set from the input portion 51. The orifices to be used (inserted) and diameters of the orifices capable of sustaining a pressure at which electrical discharge in the electron beam source 1 (especially at the acceleration tube) does not occur are automatically calculated by the computer 50 from the gas species and the pressure around the specimen, based on a table loaded in the computer 50. At the same time, the computer automatically finds the orifices to be used and diameters of the orifices at which the pressure inside the portion extending from the specimen 11 to the imager 35 permits the beam to maintain its sufficient penetrative and resolving power, based on a table loaded in the computer 50.

FIG. 4 is a table illustrating operating conditions determined by gas species and pressure. In this example, three values of pressure (in Pa) are set: 1,000 Pa, 100 Pa, and 10 Pa. For example, an example in which the pressure is 10 Pa is described by way of example. Where the pressure is 10 Pa and $CO_2$ is the selected gas species, the operating conditions are indicated by combination B in the table. FIG. 5 is a table illustrating settings of conditions. The diameters of orifices and pump used according to usage conditions are shown. In the case of the combination B above, it is shown that the first orifice (OR31), the second orifice (OR32), and the third orifice (OR33) all have a diameter of 10 μm and the pump is a turbomolecular pump.

In this way, according to the present invention, if the pressure of the ambient gas and the gas species are set from the input portion 51 as shown in FIG. 4, then the computer 50 determines the orifices to be used and the pump satisfying the conditions from the table of FIG. 5. This determines the orifices, gas species, and pump used for the electron microscope shown in FIG. 1. In the above description, the pressure and the number of gas species shown in FIG. 4 are not limited to the illustrated items. In addition, the pressure can be increased further and the number of gas species can be increased. Similarly, the present invention is not limited to the embodiments defined by the conditions illustrated in FIG. 5. More orifices may be used and defined. Additionally, the number of the pumps is not limited to one. That is, plural pumps may also be employed.

Each of the various conditions is described in further detail below. For example, a very light gas having a small molecular weight, such as hydrogen ($H_2$), tends to raise electrical discharge in the acceleration tubes 2 more easily than other gases and, thus, the molecular weight is a quite important parameter of gas species. Gases such as hydrogen gas cannot be pumped down by an ion pump and, therefore, it is necessary to perform vacuum pumping after switching the working pump to any one of the turbomolecular pumps 21-24 or to an oil-diffusion pump (not shown) capable of evacuating hydrogen gas.

Each of the orifice members 31-34 has several orifices each having a diameter of 2 mm to 10 μm. A desired orifice diameter can be selectively positioned at the electron optical axis 25 by each respective orifice member driving mechanism. In particular, the orifices in each of the orifice members 32 and 33 of FIG. 1 preferably have orifice diameters of 2 mm, 0.5 mm, 0.1 mm, 0.05 mm, and 0.001 mm, respectively, because these orifices are closest to the specimen 11 and act most sensitively on the control of the pressure around the specimen. The orifice with the diameter 5 mm is selected when the orifice 32 is not used (not inserted or not active).

On the other hand, the orifices in each of the orifice members 31 and 34 preferably have orifice diameters of approximately 5 mm, 1 mm, 0.75 mm, 0.5 mm, and 0.1 mm, respectively. The first orifice member 31 serves to prevent inflow of gas into the acceleration tubes 2. For example, where hydrogen gas having a small molecular weight is introduced, a smaller orifice diameter is selected as an active orifice diameter from the orifice member, because as the active orifice diameter decreases, the conductance decreases, preventing permeation of the gas into the acceleration tubes 2.

Where the molecular weight of the introduced gas is large and the pressure is of the order of tens of Pa, it suffices to insert only the second and third orifice members 32 and 33 into the optical axis 25. At this time, the second and third orifice members 32 and 33 are preferably identical in orifice diameter. On the other hand, where the pressure is from hundreds of Pa to the atmospheric pressure ($=133 \times 10^4$ Pa), it is necessary to insert the four orifice members 31-34 shown in FIG. 1 into the optical axis 25. At this time, it is desired to set the orifice diameters of the second and third orifice members 32 and 33 to larger values because it is possible to secure a lower minimum magnification.

After the number and diameters of the orifices capable of sustaining a pressure at which electrical discharge of the acceleration tubes 2 does not occur are automatically calculated from the gas species and the pressure around the specimen by the computer 50, a decision is made as to whether or not the minimum magnification specified by the computer 50 is achievable when all the orifices have been inserted into the optical axis. If the minimum magnification is achieved, satisfactory results are obtained. If not so, the vacuum pumping system is optimized.

The vacuum pumping system is composed of plural vacuum pumps operating on different pumping principles. In the vacuum pumping system, a different pump is used for evacuation dependently on each different gas species. In the present invention, plural pumps are used such that various gas species can be used. Where the minimum magnification cannot be achieved, a pump (such as a turbomolecular pump) not used for ordinary high-vacuum imaging is also used for vacuum pumping. In this way, the number of pumps is increased, thus increasing the effective pumping speed. A recalculation is performed to determine whether the vacuum pumping can be attained if the previously calculated orifice diameter is increased. Thus, a decision is made as to whether the minimum magnification can be accomplished. As described above, an electron microscope can be realized which can automatically select optimum orifices and pumping sequence if a gas species, a pressure to be realized around the specimen, and a minimum magnification during imaging are set on the computer 50.

As described so far, according to the present invention, an electron microscope can be offered which permits one to observe the process of a reaction between a gas and a solid at an atmospheric pressure close to ambient pressures actually encountered by causing a computer to find the number and diameters of orifices at which a pressure can be sustained without electrically discharging acceleration tubes, from the gas species, and the pressure around the specimen.

Furthermore, an electron microscope can be offered which permits one to observe the process of a reaction between a gas and a solid at an atmospheric pressure close to ambient pressures actually encountered by causing a computer to find the number and diameters of orifices placed between a specimen and an imager from a gas species and a pressure around the specimen in order that the pressure inside the portion extending from the specimen to the imager permits the beam to maintain its sufficient penetrative and resolving power.

In addition, an electron microscope can be offered which permits one to observe the process of a reaction between a gas and a solid, for example, at atmospheric pressure. Further, an electron microscope can be offered which can be controlled to conditions adapted for various gases under atmospheric-pressure ambient while using a conventional holder and, therefore, an electron microscope can be offered which permits one to observe the process of a reaction between a gas and a solid at an atmospheric pressure close to ambients actually encountered.

When conditions of an ambient around a specimen are specified from a computer control portion, some or all of orifices can be selected and inserted and a pumping sequence can be selected according to the specified conditions.

The selection and insertion of some or all of the orifices and selection of the pumping sequence can be defined by the used gas species, pressure around the specimen, and a minimum magnification during imaging.

Furthermore, an ambient around a specimen can be matched to specified conditions by placing at least two orifices at different locations in an optical path.

In addition, an ambient around a specimen can be matched to specified conditions by installing orifice members having different combinations of orifice diameters at different positions in the optical path.

In the conventional method, the pressure around a specimen chamber could be increased only up to about $10^{-3}$ Pa to $10^{-5}$ Pa because of instrumental limitations. These pressures are satisfactory in cases where the process of a reaction between a gas and a solid is observed and fundamental knowledge should be obtained. However, it is expected by the industrial world that the reaction mechanism between a gas and a solid in an atmosphere close to actually encountered ambients will be elucidated. Hence, it is desired that a breakthrough will be made in this technical field.

Accordingly, the present invention has realized an electron microscope which can achieve automatic optimum selection of orifices and pumping sequence if a gas species, an achieved pressure around a specimen, and a minimum magnification during imaging are set on a controlling computer. As a result, observation of the process of a reaction between a gas and a solid at a pressure unachievable heretofore (e.g., atmospheric pressure) is realized. Hence, the invention can contribute to elucidation of the reaction mechanism in a state close to actually encountered ambients.

Having thus described my invention with the detail and particularity required by the Patent Laws, what is desired protected by Letters Patent is set forth in the following claims.

The invention claimed is:

1. An electron microscope comprising:
an electron beam source for generating an accelerated electron beam;
electromagnetic lenses for focusing the emitted beam;
alignment coils for adjusting the optical axis of the beam transmitted through the lenses;
a control unit for controlling an ambient pressure around a specimen;
at least one vacuum pump mounted in a given location along an electron optical column;
a gas inlet device mounted near the specimen;
a plurality of orifices arranged inside the electron optical column and placed between the specimen and the electron beam source, each of said orifices being capable of changing its diameter;
an imager for creating an image based on a signal arising from a region of the specimen illuminated with the electron beam;
an image output device for recording and displaying the image; and
a computer for controlling these components, the computer being programmed to find the orifices to be used and diameters of orifices capable of sustaining a pressure at which electrical discharge in the electron beam source does not occur from a gas species and a pressure around the specimen.

2. An electron microscope comprising:
an electron beam source for generating an accelerated electron beam;
electromagnetic lenses for focusing the accelerated electron beam;
alignment coils for adjusting the optical axis of the beam transmitted through the lenses;
a control unit for controlling an ambient pressure around a specimen;
at least one vacuum pump mounted in a given location of an electron optical column;
a gas inlet device mounted near the specimen;
an imager for creating an image based on a signal arising from a region of the specimen illuminated with the electron beam;
an image output device for recording and displaying the image;
a plurality of orifices arranged inside the electron optical column and placed between the specimen and the imager, each of said orifices being capable of changing its diameter; and
a computer for controlling these components, the computer being programmed to find the orifices to be used and diameters of orifices placed between the specimen and the imager from a gas species and a pressure around the specimen such that pressure inside a portion extending from the specimen to the imager permits the beam to maintain its sufficient penetrative and resolving power.

3. An electron microscope comprising:
an electron beam source for emitting an electron beam;
electromagnetic lenses for focusing the emitted beam;
alignment coils for adjusting the optical axis of the beam transmitted through the lenses;
a control unit for controlling an ambient pressure around a specimen;
at least one vacuum pump mounted in a given location of an electron optical column;
a gas inlet device mounted near the specimen;
an imager for creating an image based on a signal arising from a region of the specimen illuminated with the electron beam;
a plurality of orifices arranged inside the electron optical column and placed between the electron beam source and the specimen and between the specimen and the imager, each of said orifices being capable of changing its diameter;
an image output device for recording and displaying the image; and
a computer for controlling these components, the computer being programmed to find the orifices placed between the electron beam source and the specimen to be used and diameters of said found orifices capable of sustaining a pressure in the electron beam source at which electrical discharge does not occur from a gas species and a pressure around the specimen and finds the orifices between the specimen and the imager to be used and diameters of said found orifices placed between the specimen and the imager from the gas species and pressure around the specimen such that pressure inside a portion extending from the specimen to the imager permits the beam to maintain its sufficient penetrative and resolving power.

4. An electron microscope as set forth in any one of claims 1 to 3, wherein said orifices are at least two in number and placed at different positions in an optical path.

5. An electron microscope as set forth in any one of claims 1 to 3, wherein said orifices form at least two combinations of orifice diameters and the combinations are placed at different positions in an optical path.

6. An electron microscope as set forth in any one of claims 1 to 3, wherein the computer is further programmed such that when conditions of the ambient pressure around the specimen are specified from an input portion of the computer, the computer selects some out of the orifices, carries out insertion of the selected orifices, and selects a pumping sequence according to the specified conditions.

7. An electron microscope as set forth in claim 6, wherein the computer is further programmed such that said selection of some of the orifices, insertion of the selected orifices, and selection of the pumping sequence are defined by the gas species, the pressure around the specimen, and a minimum magnification during imaging.

* * * * *